(12) United States Patent
Morita et al.

(10) Patent No.: US 6,483,678 B1
(45) Date of Patent: Nov. 19, 2002

(54) ARC-EXTINGUISHING CIRCUIT AND ARC-EXTINGUISHING METHOD

(75) Inventors: Tetsuo Morita, Hanno (JP); Hiroshi Jou, Hanno (JP)

(73) Assignee: Shindengen Electric Manufacturing Co., Ltd., Tokyo (JP)

( * ) Notice: Subject to any disclaimer, the term of this patent is extended or adjusted under 35 U.S.C. 154(b) by 0 days.

(21) Appl. No.: 09/423,559

(22) PCT Filed: Mar. 17, 1999

(86) PCT No.: PCT/JP99/01305

§ 371 (c)(1),
(2), (4) Date: Nov. 10, 1999

(87) PCT Pub. No.: WO99/47727

PCT Pub. Date: Sep. 23, 1999

(30) Foreign Application Priority Data

Mar. 18, 1998 (JP) .......................................... 10-089310
Mar. 18, 1998 (JP) .......................................... 10-089311

(51) Int. Cl.[7] .................................................. H02H 3/00
(52) U.S. Cl. ................. 361/2; 204/192.12; 204/298.41
(58) Field of Search .......................... 361/4, 10, 2, 55, 361/56, 57, 58, 93.1, 93.9, 91.1, 100, 101, 234, 235, 255; 204/192.12, 298.01, 298.02, 298.04, 298.07, 298.08, 298.41; 427/562, 580

(56) References Cited

U.S. PATENT DOCUMENTS 3,700,970 A * 10/1972 Miyoshi ...................... 361/58
5,281,321 A * 1/1994 Sturmer et al. ......... 204/298.08
5,427,669 A * 6/1995 Drummond ............. 204/298.08

FOREIGN PATENT DOCUMENTS

| JP | 7-197258 | 8/1995 | ......... H01L/21/203 |
| JP | 9-71863 | 3/1997 | ......... H01L/21/203 |
| JP | 10-46324 | 2/1998 | ........... C23C/14/32 |

* cited by examiner

Primary Examiner—Ronald W. Leja
(74) Attorney, Agent, or Firm—Armstrong, Westerman & Hattori, LLP.

(57) ABSTRACT

An arc extinguishing circuit for use with glow discharges employed in manufacturing thin-film apparatus (such as, sputtering apparatus etc.), and is capable of more rapidly extinguishing arc discharges occurring within a glow discharge. The arc extinguishing circuit includes a voltage sense circuit, a secondary winding, a switch element, a positive output terminal, and a negative output terminal, the voltage sense circuit having a voltage sense capacitor and a primary winding. When the potential of the negative output terminal rapidly rises so that an arc discharge occurs while generating a glow discharge across the positive output terminal and the negative output terminal, a current flows from the voltage sense capacitor connected to the negative output terminal through the primary winding, and a voltage is induced at the secondary winding magnetically coupled to the primary winding and the switch element connected to the secondary winding conducts. The positive output terminal and the negative output terminal are therefore short-circuited and the arc discharge is extinguished.

10 Claims, 12 Drawing Sheets

ARC-EXTINGUISHING CIRCUIT AND ARC-EXTINGUISHING METHOD

TECHNICAL FIELD

The present invention relates to an arc extinguishing circuit; and more particularly, relates to an arc extinguishing circuit capable of extinguishing arc discharges occurring within a glow discharge when used in a power supply circuit for generating a glow discharge.

BACKGROUND ART

Conventional glow discharge power supply circuits comprise a direct current (d.c.) voltage generating circuit, with a positive terminal and a negative terminal connected to the anode and cathode of the d.c. voltage generating circuit respectively. The negative terminal is connected to a target and the positive terminal is connected to a substrate holder. A substrate is then supported by the substrate holder so that the target and a surface of the substrate (hereinafter referred to as the "substrate surface") face each other within a low pressure atmosphere. When the d.c. voltage generating circuit is then activated and a d.c. voltage is applied across the positive terminal and the negative terminal, a glow discharge is generated across the substrate surface and the target, the target is sputtered and a thin-film is formed on the substrate surface.

However, arc discharges can occur when certain kinds of abnormalities occur within the glow discharge. When arc discharging occurs, the target is sputtered in a localized manner and the thin film is unevenly formed on the substrate surface. Depending on the circumstances, this can be destructive to the thin-film formed on the substrate surface.

In order to resolve the aforementioned problems, it is the object of the present invention to provide an arc extinguishing circuit capable-of reliably suppressing arc discharges when used in a power supply for generating a glow discharge.

SUMMARY OF THE INVENTION

An arc extinguishing circuit of the present invention comprises a switch element equipped with a control terminal and two input/output terminals, with conduction across the two input/output terminals being based on a voltage inputted to the control terminal, a sense circuit, being a circuit having a primary winding and a voltage sense capacitor connected in series, with one end thereof connected to one input/output terminal and a remaining end thereof connected to the remaining input/output terminal and a secondary winding being magnetically coupled with the primary winding and having one end connected to the control terminal and a remaining end connected to one of the input/output terminals.

The arc extinguishing circuit of the present invention can also be configured in such a manner that when a trigger current flows in the primary winding, the voltage sense capacitor discharges due to the switch element conducting due to a voltage induced in the secondary winding, and a discharge current flows in the primary winding, with the discharge current flowing in the primary winding in the same direction as the trigger current.

The arc extinguishing circuit of the present invention can also have at least one inductance element, with one end of the inductance element being connected to one or both of the input/output terminals.

An arc extinguishing circuit of the present invention a switch element equipped with a control terminal and two input/output terminals, with conduction across the two input/output terminals being based on a voltage inputted to the control terminal, a sense circuit, being a circuit having a primary winding and a voltage sense capacitor connected in series, with one end thereof connected to one input/output terminal and a remaining end thereof connected to the remaining input/output terminal, a secondary winding being magnetically coupled with the primary winding and having one end connected to the control terminal and a remaining end connected to one of the input/output terminals, a resonant circuit, constituted by a resonant inductance element and a resonant capacitor connected in series, with one end thereof connected to one input/output terminal and a remaining end thereof connected to the remaining input/output terminal and a diode inserted across one or both of said one end of the resonance circuit and said one input/output terminal or said remaining terminal of the resonance circuit and said remaining input/output terminal.

The arc extinguishing circuit of the present invention can also comprise at least one inductance element, with one end of the inductance element being connected to a terminal of the resonant capacitor.

The arc extinguishing circuit of the present invention can also comprise a voltage limiting circuit connected in parallel with the voltage sense circuit and constructed in such a manner as to prevent a voltage across the terminals of the voltage sense circuit from rising above a fixed voltage when a voltage of a polarity which is opposite to a polarity in a steady state occurs across the terminals of the resonant capacitor.

An arc extinguishing method of the present invention comprises the steps of pre-charging a resonant capacitor while supplying a fixed voltage to a load from first and second output terminals in a steady state, when load impedance rapidly drops, sensing the rapid drop in impedance, causing a switch element connected across the first and second output terminals to conduct, short-circuiting the first and second output terminals, and discharging the resonant capacitor; causing the discharged current to flow through a resonant inductance, and causing the resonant capacitor and the resonant inductance element to resonate, generating a voltage, of a polarity which is opposite to the polarity generated in the steady state, at the resonant capacitor due to the resonance and putting the switch element into a non-conducting state using the reverse voltage and having the voltage across the first and second output elements revert to the steady state voltage.

The arc extinguishing method of the present invention can further comprise the steps of pre-inserting a diode element in the path of current flowing between the first and second output terminals via the switch element when the switch element is in a conducting state and the first and second output terminals are short-circuited and reverse biasing the diode element using a voltage generated at the resonant capacitor of an opposite polarity to the voltage generated in a steady state so as to halt resonance when a current flows between the first and second output terminals via the switch element.

The arc extinguishing method of the present invention can also comprise the steps of connecting a circuit constituted by the voltage sense capacitor and the primary winding connected in series across the first and second output terminals and pre-charging the voltage sense capacitor in the steady state and, when the load impedance falls rapidly, causing a current to flow in the primary winding due to discharging of the voltage sense capacitor, inducing a voltage in a secondary winding magnetically coupled with the primary winding, and putting the switch element into a conducting state using the voltage induced at the secondary winding.

The arc extinguishing method of the present invention can further comprise the steps of connecting a delay circuit to the voltage sense capacitor and increasing the time taken from commencing charging of the voltage sense capacitor until the voltage across both terminals of the voltage sense capacitor becomes the voltage across both terminals occurring in the steady state using the delay circuit.

In the present invention having the above configuration, both terminals of a d.c. power supply for generating a d.c. voltage are respectively connected to input/output terminals of a switch element, with the input/output terminals being taken as first and second output terminals, respectively, with each being connected to an electrode that is within a vacuum. The d.c. power supply is then activated with the electrodes separated from each other, a high voltage is applied across the electrodes and a glow discharge is generated. One electrode is connected to a target and the other electrode is connected to a substrate. When the target and substrate are arranged in such a manner as to face each other, the target material is sputtered by the glow discharge and a thin film is formed on the substrate surface.

The present invention also has a voltage sense circuit constituted by a voltage sense capacitor and a primary winding connected together in series. When the voltage sense capacitor is pre-charged in a steady state and an arc discharge then occurs as the result of some kind of abnormality so that the potential difference across the first and second output terminals drops rapidly, a discharge current is supplied from the voltage sense capacitor to the primary winding and a voltage is induced at the secondary winding magnetically coupled with the primary winding.

When the voltage sense capacitor is pre-charged to a voltage of an appropriate value and a voltage is induced at the secondary winding, the switch element in a non-conducting state connected across the first and second output terminals can be put into a conducting state, the first and second output terminals are short-circuited, the electrodes are short-circuited and arc discharges can be extinguished. As arc discharges can be extinguished a short time after occurring, the quality of thin films formed on the substrate surface does not deteriorate.

The arc extinguishing circuit of the present invention is configured in such a manner that when a trigger current flows in the primary winding, the switch element conducts due to the voltage induced at the secondary winding so that when the voltage sense capacitor discharges, a discharge current flows in the primary winding in the same direction as the trigger current.

By adopting this kind of configuration, the discharge current flows in the same direction as the trigger current that causes the switch element to conduct. The conducting state of the switch element is therefore maintained while the discharge current is flowing and is maintained until discharge of the voltage sense capacitor is complete.

Furthermore, in the present invention, an inductance element is provided, with one end thereof being connected to one or both of the input/output terminals.

In this case, the current flowing between the electrodes can be limited by the inductance element even when arc discharges occur due to an abnormality and a large current flows between the electrodes, and the potential difference across the electrodes can be rapidly reduced. Therefore, when an arc discharge occurs, the pre-charged voltage sense capacitor is discharged, the switch element is made to conduct by the discharge current and the arc discharge can be extinguished.

A further arc extinguishing circuit of the present invention has a resonance circuit. With this configuration, the voltage sense capacitor and the resonant capacitor are pre-charged in the steady state. When an arc discharge occurs in this state, the switch element conducts so that the output terminals are short-circuited, the resonant capacitor discharges, the discharge current flows through the resonant inductance, and the resonant capacitor and the resonant inductance element resonate. A voltage of a polarity opposite to that occurring in the steady state is therefore generated at the resonant capacitor due to this resonance and the switch element is therefore put into a non-conducting state.

As an example, if a diode element is inserted beforehand in the path of current flowing between the first and second output terminals via the switch element when the first and second output terminals are short-circuited, when a current flows between the first and second output terminals, the diode element is reverse biased by the voltage occurring at the resonant capacitor of a polarity opposite to that which occurs in the steady state and the switch element is therefore put into a non-conducting state.

In this case, a non-conducting state can be entered before the voltage sense capacitor has finished discharging. The time until the switch element returns to a non-conducting state can therefore be made short and the time taken to return to a steady state after extinguishing an arc discharge can also be made short.

When a resonance circuit is provided in this way, if the reverse voltage occurring due to the resonance becomes too large, directly after the first and second output terminals are short-circuited and the arc discharge is extinguished, the voltage across the first and second output terminals rises excessively and again becomes a voltage at which arc discharges become possible so that arc discharges may occur again.

Therefore, in the present invention a voltage limiting circuit is connected in parallel with the voltage sense circuit. In this case, as it is possible to ensure that the voltage across the first and second output terminals does not rise above a prescribed voltage, the voltage across the first and second output terminals can be made so as not to rise as high as a voltage at which arc discharges are possible by setting the prescribed voltage to an appropriate value. It can therefore be ensured that arc discharges do not occur again directly after the first and second output terminals are short-circuited.

Further, according to an arc extinguishing method of the present invention, first and second output electrodes are each connected to one electrode that is within a vacuum, and when a d.c. power supply is turned on with each electrode placed apart from the other electrode, a high voltage is applied across the electrodes and a glow discharge is generated in a steady state.

When an arc discharge then occurs due to some kind of abnormality and the impedance across the electrodes falls rapidly, this abrupt fall is sensed, a switch element connected across the first and second output terminals is put into a conducting state, the first and second output terminals are short-circuited and the electrodes are short-circuited so that the arc discharge can be extinguished.

The switch element is made to conduct and the arc discharge is extinguished, the resonant capacitor pre-charged in a steady state is made to discharge, the current discharged flows through the resonant inductance and the resonant capacitor and resonant inductance element resonate. A voltage of a reverse polarity to that generated in the steady state is therefore generated at the resonant capacitor, the switch element is put into a non-conducting state by the reverse voltage and the steady state is made to return.

In the arc extinguishing method of the present invention, the configuration may be such that a circuit constituted by a voltage sense capacitor and a primary winding connected in series is connected across the first and second output terminals and the voltage sense capacitor is pre-charged in a steady state. When the load impedance then falls rapidly, a current flows in the primary winding due to discharging of the voltage sense capacitor, a voltage is induced in the secondary winding magnetically coupled to the primary winding and the switch element is put into a conducting state by the voltage induced at the secondary winding.

With this configuration, abrupt falls in load impedance are sensed using discharging of the voltage sense capacitor, the discharge current flows through the primary winding and the switch element is made to conduct. The first and second output terminals are therefore short-circuited and it is possible to extinguish arc discharges.

With the arc extinguishing method of the present invention, a delay circuit is connected to the voltage sense capacitor and the time from charging of the voltage sense capacitor being started to the voltage across both terminals reaching that of the steady state is lengthened using this delay circuit.

By adopting this kind of configuration, the voltage induced in the secondary winding as a result of current flowing in the primary winding due to the voltage across the terminals of the voltage sense capacitor is prevented from reaching a voltage at which the switch element can enter a conducting state before the voltage across the first and second output terminals reaches the voltage occurring in a steady state where a glow discharge is possible.

Therefore, before a glow discharge is generated, when the state is such that an arc discharge is possible, it is ensured that it is not possible for the switch element to erroneously conduct, resulting in a short circuit across the first and second output terminals to short circuit; and a glow discharge can therefore be generated in a reliable manner.

These and other features of the invention will be understood upon reading of the following description along with the drawings.

DETAILED DESCRIPTION OF THE PREFERRED EMBODIMENTS

The following is a detailed description, with reference to the drawings, of the preferred embodiments of a power supply circuit of the present invention.

Figure 1:
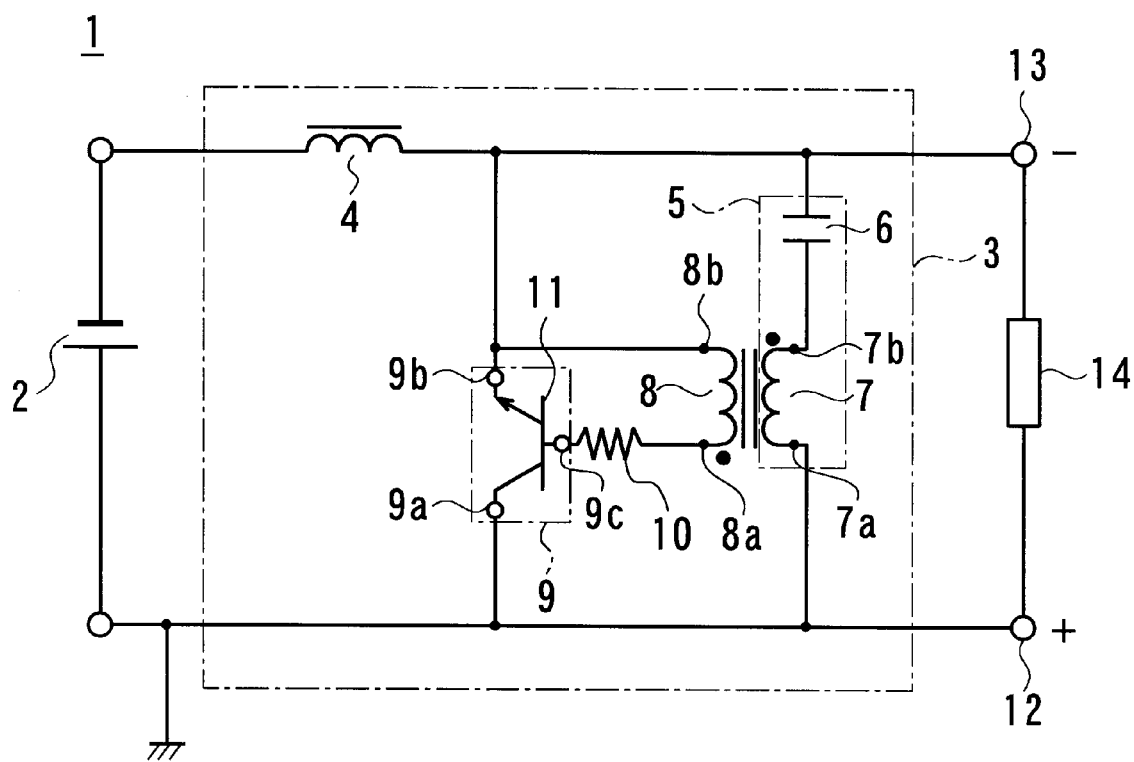
FIG. 1 is a circuit diagram showing a power supply circuit of a first embodiment of the present invention.

Numeral 1 of FIG. 1 represents a glow discharge power supply circuit of a first embodiment of the present invention. This power supply 1 comprises a d.c. voltage generating circuit 2, a positive output terminal 12, and a negative output terminal 13. The positive electrode of the d.c. voltage generating circuit 2 is connected to the positive output terminal 12 which is in turn connected to ground, and the remaining negative electrode is connected to the negative output terminal 13 via a current limiting coil 4 described later. The configuration is such that when the d.c. voltage generating circuit 2 is turned on, a d.c. voltage that is negative with respect to earth potential is applied to the negative output terminal 13.

Figure 17:
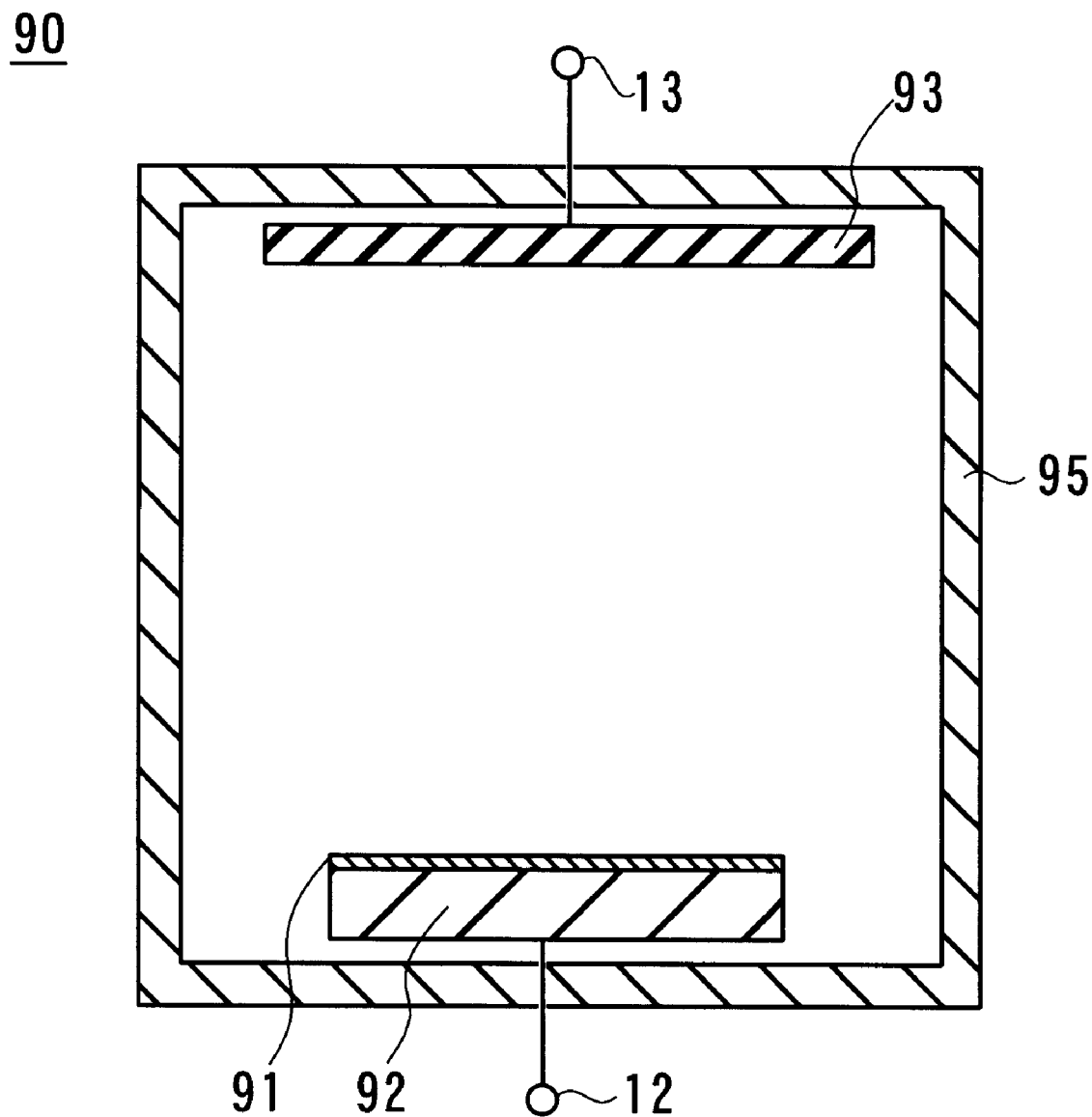
FIG. 17 is a cross-sectional view showing the configuration of a sputtering device employing the power supply circuit of the present invention.

A sputtering apparatus provided with the power supply 1 described above is represented by numeral 90 in FIG. 17. This sputtering apparatus 90 comprises a vacuum chamber 95, a substrate holder 92, and a target 93. The substrate holder 92 is arranged inside the vacuum chamber 95 at the bottom and the target 93 is arranged in confront relation with the substrate holder 92. The positive output terminal 12 of the power supply 1 is connected to the substrate holder 92 and the negative output terminal 13 is connected to the target 93.

A substrate 91 is supported by the substrate holder 92 in advance, the target 93 and a surface of the substrate 91 (hereinafter referred to as the "substrate surface") are made to face each other and the vacuum chamber 95 is evacuated.

When the d.c. voltage generating circuit 2 is turned on so that a high d.c. voltage is applied across the positive output terminal 12 and the negative output terminal 13 under these conditions a glow discharge is generated. Numeral 14 of FIG. 1 represents a virtual load indicating the impedance across the positive output terminal 12 and the negative output terminal 13 at the time of discharge. The load 14 is of a high-impedance while a glow discharge is maintained.

When a glow discharge is generated, the target material is sputtered and a thin film comprised of target material is formed on the substrate surface.

However, when certain abnormalities occur and the glow discharge becomes an arc discharge, the target is sputtered in a localized manner and an uneven thin-film is formed on the substrate surface. An arc extinguishing circuit 3 is therefore provided as a countermeasure at the power supply 1 of the present invention.

The arc extinguishing circuit 3 comprises the current limiting coil 4, a voltage sense circuit 5, a secondary winding 8, and a switch element 9.

The current limiting coil 4 is inserted across the negative electrode of the d.c. voltage generating circuit 2 and the negative output terminal 13, so that current is supplied to the load 14 from the d.c. voltage generating circuit 2 via the current limiting coil 4 while the d.c. voltage generating circuit 2 is operating.

When some kind of abnormality occurs so that an arc discharge occurs while generating a glow discharge in a steady state, the impedance of the equivalent load 14 drops rapidly and a large current is expected to flow between the positive output terminal 12 and the negative output terminal 13. However, such a flow current is limited by the current limiting coil 4 and the potential difference across the positive output terminal 12 and the negative output terminal 13 therefore becomes small.

The aforementioned voltage sense circuit 5 is provided between the positive output terminal 12 and the negative output terminal 13. The voltage sense circuit 5 comprises a voltage sense capacitor 6 and a primary winding 7 connected in series. The voltage sense capacitor 6 is arranged on the side of the negative electrode of the d.c. voltage generating circuit 2; and the primary winding 7 is arranged on the side of the negative electrode of the d.c. voltage generating circuit 2. In this steady state, the voltage sense capacitor 6 is pre-charged by the voltage across both terminals of the d.c. voltage generating circuit 2 and current does not flow through the primary winding 7. At this time, a negative polarity voltage is generated at the terminal on the side of the negative electrode of the voltage sense capacitor 6; and a positive polarity voltage is generated at the terminal on the positive electrode side.

The terminal potential on the negative electrode side of the voltage sense capacitor 6 rises rapidly when the potential difference between the positive output terminal 12 and the negative output terminal 13 is small because the positive output terminal 12 is connected to ground. The potential of the terminal on the positive electrode side of the voltage sense capacitor 6 also rises in accompaniment with rises in the potential of the terminal on the negative electrode side.

Figure 2:
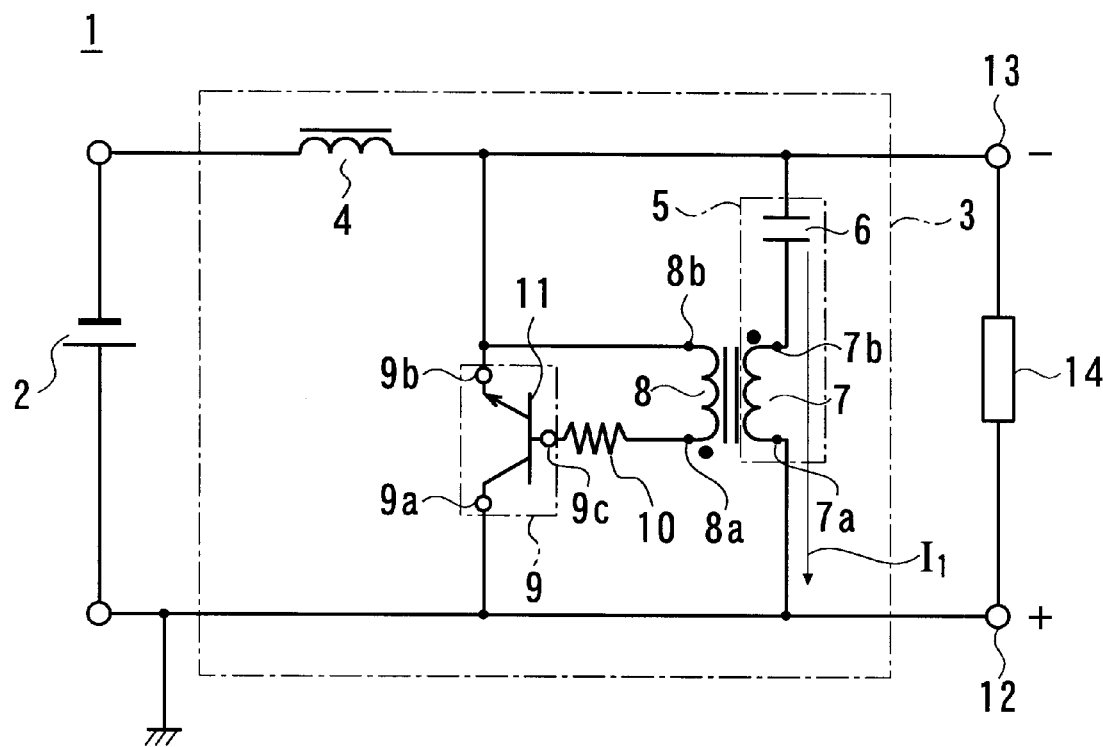
FIG. 2 is a first view illustrating the operation of the power supply circuit of the first embodiment of the present invention.
Figure 3:
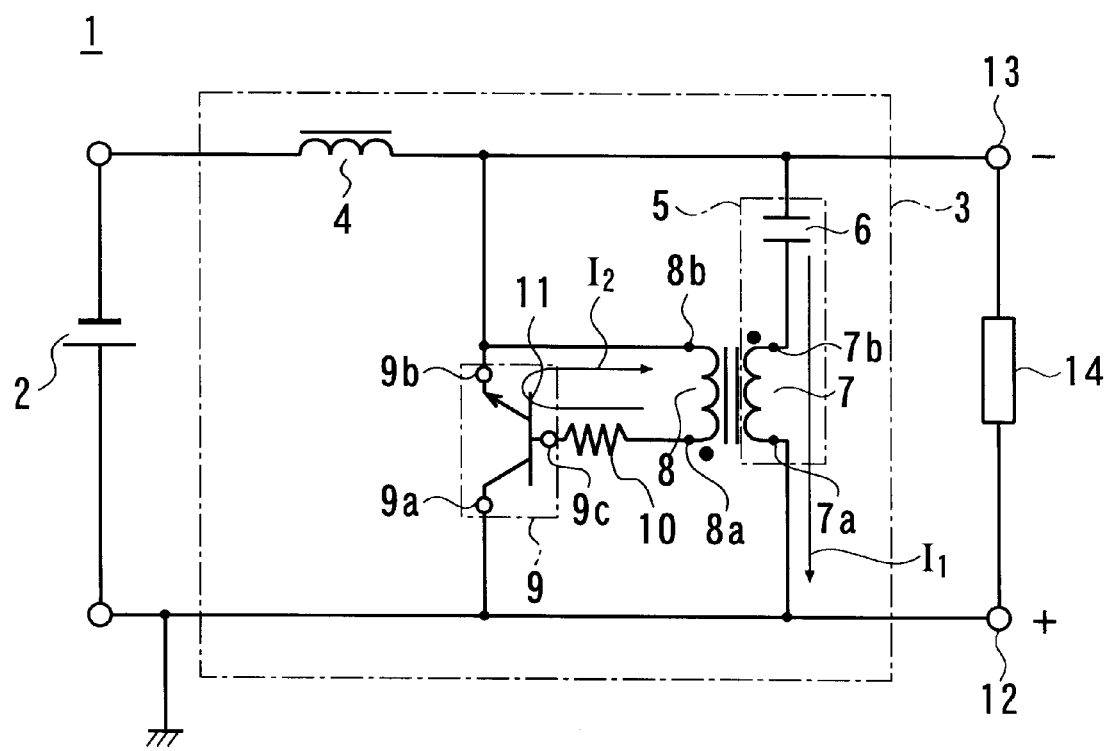
FIG. 3 is a second view illustrating the operation of the power supply circuit of the first embodiment of the present invention.

As the primary winding 7 is connected to the terminal on the positive electrode side, when the potential of the terminal on the positive electrode side becomes higher than the earth potential, the voltage sense capacitor 6 discharges; and as shown in FIG. 2, a discharge current $I_1$ flows from the voltage sense capacitor 6 through the primary winding 7.

The secondary winding 8 is magnetically coupled with the primary winding 7 and when the discharge current $I_1$ flows through the primary winding 7, a voltage is induced across both ends of the secondary winding 8.

The aforementioned switch element 9 comprises first and second input/output terminals 9a and 9b, a control terminal 9c and an NPN-type transistor 11. The collector terminal and emitter terminal of the transistor 11 are connected to the first and second input/output terminals 9a and 9b, respectively, with the base terminal constituting the control terminal 9c.

The control terminal 9c is connected to one terminal 8a of the secondary winding 8 and the second input/output terminal 9b is connected to the other terminal 8b of the secondary winding 8. The secondary winding 8 is magnetically coupled with the primary winding 7 in such a manner that a voltage of a positive polarity occurs at the terminal 8a on the side of the control terminal 9c and a voltage of a negative polarity occurs at the terminal 8b on the side of the second input/output terminal as a result of the discharge current $I_1$ flowing at the primary winding 7. When a voltage is then induced at the secondary winding 8, a voltage of a higher voltage than the voltage applied to the second input/output terminal 9b is applied to the control terminal 9c. When a voltage higher than the voltage applied to the second input/output terminal 9b is applied to the control terminal 9c, the emitter-base junction of the transistor 11 becomes forward biased.

The positive output terminal 12 is connected to the first input/output terminal 9a, the negative output terminal 13 is connected to the second input/output terminal 9b and a voltage that is positive from the point of view of the second input/output terminal 9b is applied to the first input/output terminal 9a. When the emitter-base junction of the transistor 11 is forward biased, the switch element 9 conducts and a current $I_2$ flows from the terminal 8a for the positive electrode of the secondary winding to the terminal 8b for the negative electrode of the secondary winding via the switch element 9. When the switch element 9 conducts, the positive output terminal 12 and the negative output terminal 13 are short-circuited.

When an arc discharge occurs, the switch element 9 conducts and the time until the positive output terminal 12 and the negative output terminal 13 are short-circuited is extremely short (in the region of a few microseconds) and a temporarily occurring arc discharge is instantaneously extinguished.

Figure 4:
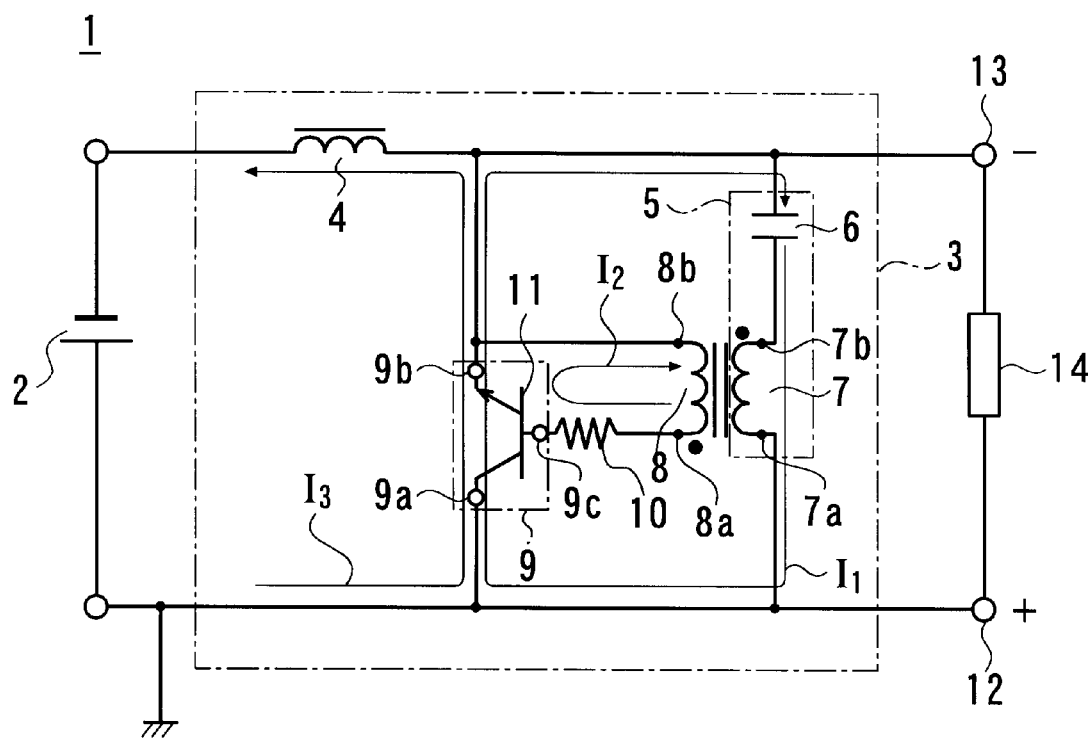
FIG. 4 is a third view illustrating the operation of the power supply circuit of the first embodiment of the present invention.

When the positive output terminal 12 and the negative output terminal 13 are short-circuited, as shown in FIG. 4, the discharge current $I_1$ flowing from the voltage sense capacitor 6 flows through the primary winding 7b and is then fed-back from the primary winding 7b to the voltage sense capacitor 6 via the switch element 9. At this time, the discharge current $I_1$ flows through the switch element 9 from the side of the positive output terminal 12 to the side of the negative output terminal 13, while on the other hand, the discharge current $I_1$ flows through the primary winding 7 from the side of the negative output terminal 13 to the side of the positive output terminal 12 in the opposite direction to the flow through the switch element 9.

The discharge current $I_1$ flows in this kind of short circuit, and a current $I_3$ flows from the positive electrode of the d.c. voltage generating circuit 2 to the negative electrode of the d.c. voltage generating circuit 2 via the switch element 9 and the current limiting coil 4.

Figure 5:
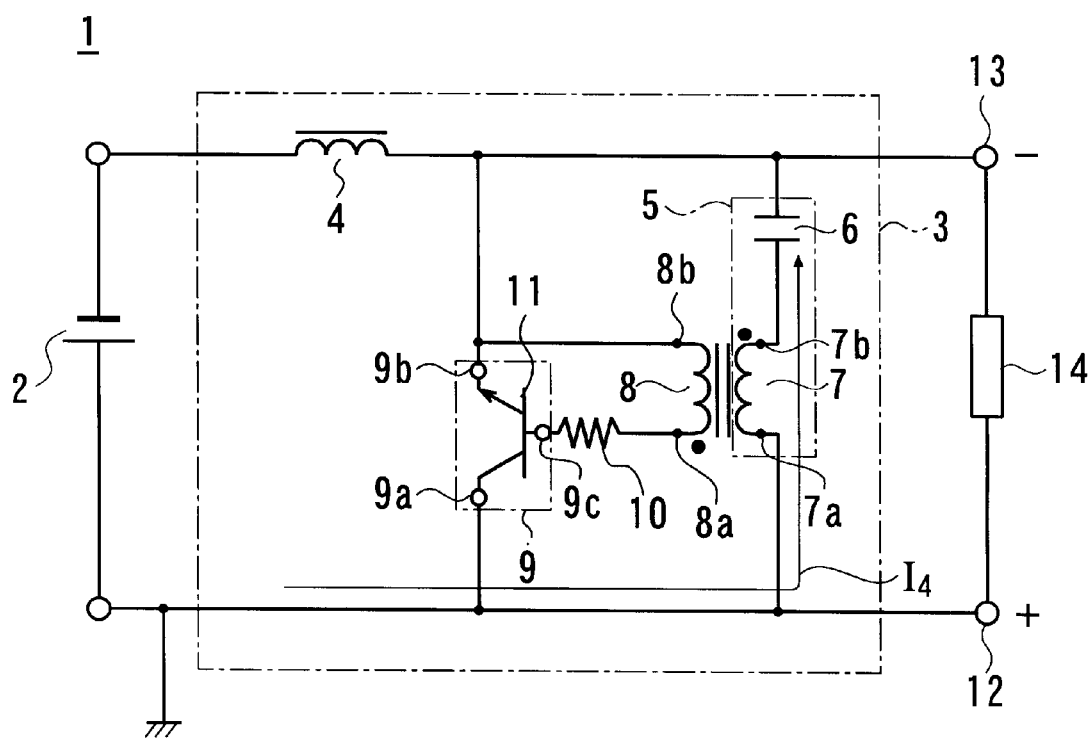
FIG. 5 is a fourth view illustrating the operation of the power supply circuit of the first embodiment of the present invention.

When discharging of the voltage sense capacitor 6 finishes and the discharge current $I_1$ is no longer supplied to the primary winding 7, the voltage induced at the secondary winding 8 disappears. The switch element 9 therefore becomes non-conducting and, as shown in FIG. 5, a current 14 flows from the positive electrode of the d.c. voltage generating circuit 2 to the voltage sense capacitor 6 via the primary winding 7, and the voltage sense capacitor 6 is charged. The voltage sense capacitor 6 is charged, the potential of the negative output terminal 13 drops; and when the potential of the negative output terminal 13 falls to the same potential as for the steady state, a situation where glow discharge is possible is returned to.

As described above, according to the power supply 1 of the first embodiment of the present invention, even if an arc discharge occurs, the arc discharge can be extinguished in a very short time (in the region of a few microseconds). A uniform thin film can therefore be formed when forming a thin film by sputtering a target material on a substrate surface using a glow discharge without the thin film being formed in an uneven manner or being damaged due to arc discharges continuing for long periods of time.

Figure 6:
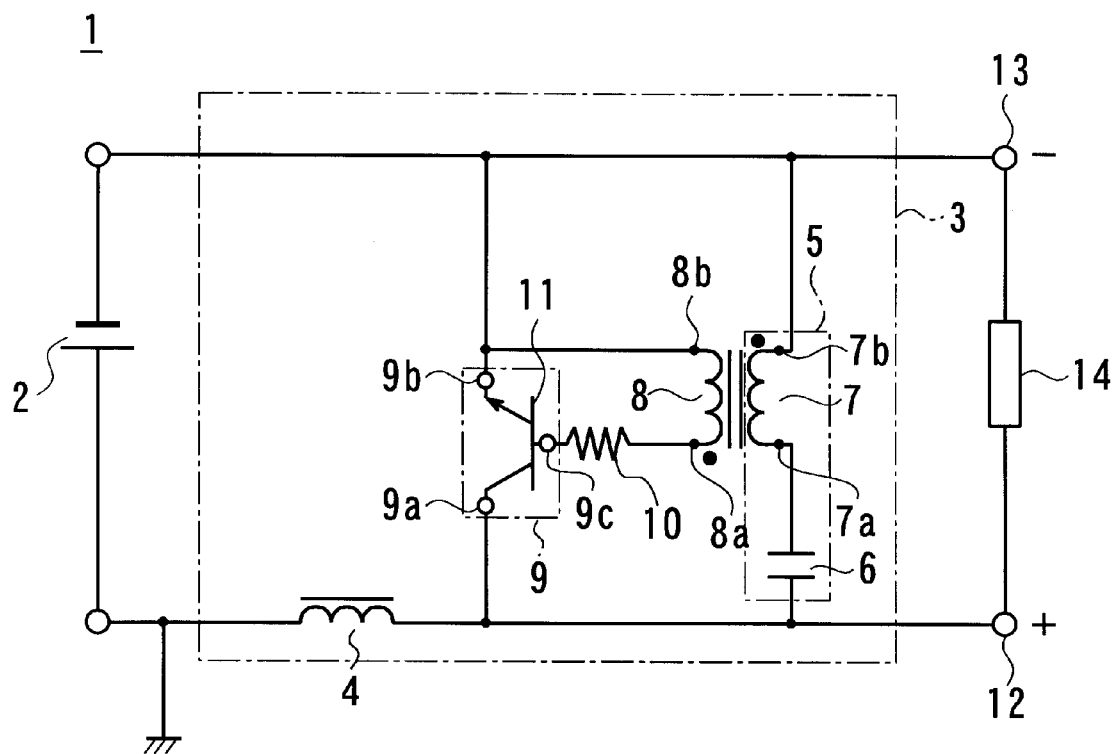
FIG. 6 is a circuit diagram showing a first modified example of the power supply circuit of the first embodiment of the present invention.

In FIG. 1 to FIG. 5, circuitry is shown where the current limiting coil 4 is provided across the negative output terminal 13 and the negative electrode of the d.c. voltage generating circuit 2 and the voltage sense capacitor 6 is arranged on the side of the negative output terminal 13. However, the configuration of the present invention is by no means limited in this respect and, as shown in FIG. 6, the current limiting coil 4 can also be provided across the negative output terminal 13 and the negative electrode of the d.c. voltage generating circuit 2, while the voltage sense capacitor 6 can also be arranged on the side of the positive output terminal 12.

Further, the element for limiting the current flowing through the load when an arc discharge occurs is by no means limited to the current limiting coil 4.

Figure 7:
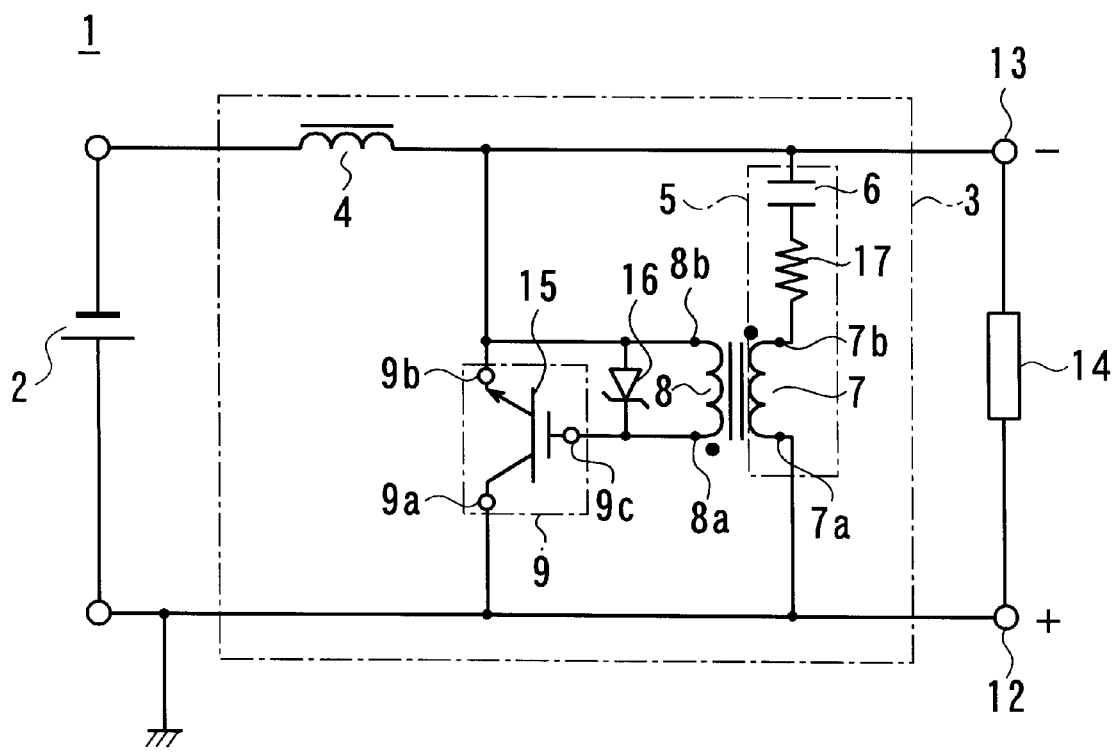
FIG. 7 is a circuit diagram showing a second modified example of the power supply circuit of the first embodiment of the present invention.

In FIG. 1 to FIG. 6, the switch element 9 is shown as a circuit comprising an NPN-type transistor 11 but the configuration of the present invention is by no means limited in this respect and, as shown in FIG. 7, a configuration having an n-channel-type IGBT (Insulated gate bipolar mode transistor) 15 as the switch element 9 is also possible, with the gate terminal of the IGBT 15 then being taken as the control terminal 9c and the collector terminal and emitter terminal being taken as the first and second input/output terminals 9a and 9b, respectively. In this case, a voltage limiting zener diode 16 is connected across the second input/output terminal 9b and the control terminal 9c in order to protect the IGBT 15 and a current limiting resistor 17 is provided between the primary winding 7 and the voltage sense capacitor 6. The switch element 9 can also be constituted by a p-channel-type IGBT, a PNP-type transistor, or a MOSFET.

The following is a description of a further embodiment of the present invention. Numeral 21 of FIG. 8 represents a further embodiment of a power supply circuit of the present invention.

Figure 8:
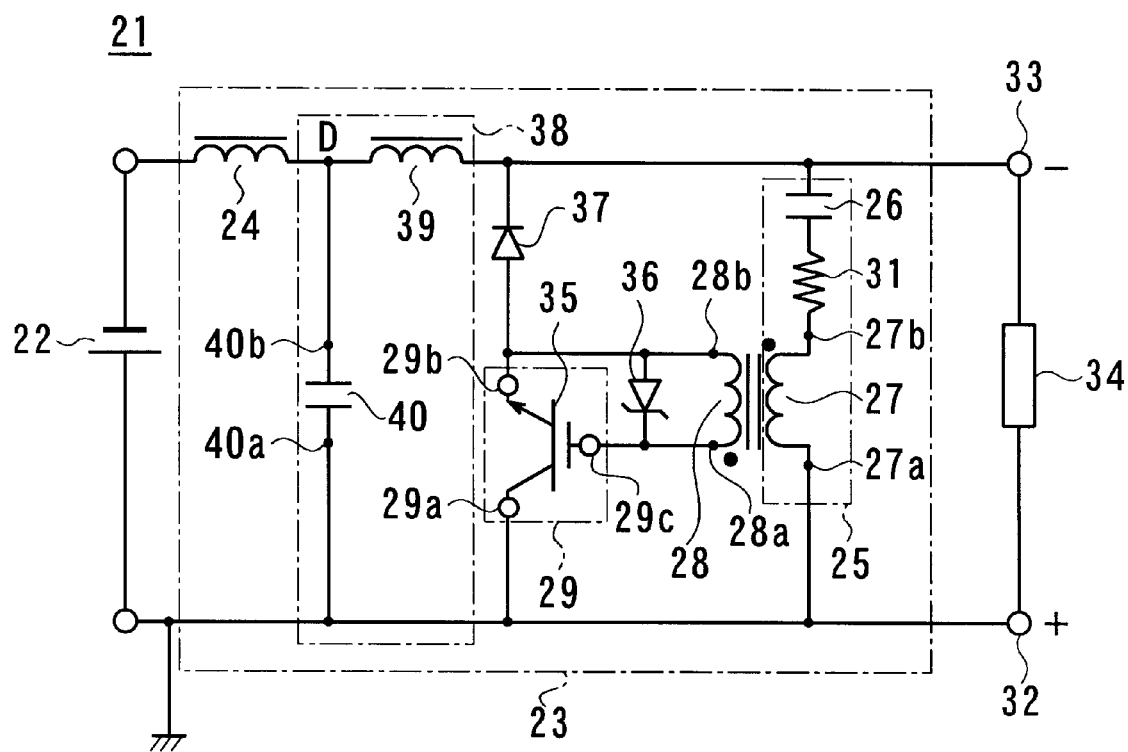
FIG. 8 is a circuit diagram showing a power supply circuit of a further embodiment of the present invention.

This power supply 21 comprises a d.c. voltage generating circuit 22, an arc extinguishing circuit 23, a positive output terminal 32, and a negative output terminal 33, of which the d.c. voltage generating circuit 22, the positive output terminal 32, and the negative output terminal 33 of FIG. 8 are the same as the d.c. voltage generating circuit 2, the positive output terminal 12, and the negative output terminal 13 of FIG. 7, respectively; and descriptions thereof are therefore omitted.

The arc extinguishing circuit 23 of FIG. 8 comprises a current limiting coil 24, a voltage sense circuit 25, a secondary winding 28, a switch element 29, a current-limiting zener diode 36, and a reverse-flow prevention diode 37, and a resonance circuit 38. Of these circuits, the current limiting coil 24, the voltage sense circuit 25, the secondary winding 28, the switch element 29, and the current-limiting zener diode 36 are the same as the current limiting coil 4, the voltage sense circuit 5, the secondary winding 8, the switch element 9, and the current-limiting zener diode 16 of FIG. 7 and descriptions thereof are therefore omitted. The current-limiting zener diode 36 and the reverse-flow prevention diode 37 are discussed in detail in the following description.

The negative electrode of the d.c. voltage generating circuit 22 and the negative output terminal 33 are connected via the current limiting coil 24 and a resonant coil 39 described later, with one end of a resonant capacitor 40 being connected to a part connecting the current limiting coil 24 and the resonant coil 39. The other end of the resonant capacitor 40 is connected to the positive output terminal 32 so that the resonance circuit 38 is constituted by the resonant coil 39 and the resonant capacitor 40.

Before forming a thin film on a substrate surface using sputtering techniques and employing the power supply 21 described above, the positive output terminal 32 and the negative output terminal 33 are connected to the substrate holder 92 and the target 93, respectively; the substrate 91 is supported on the substrate holder 92; the target 93 and the surface of the substrate 91 are made to face each other within the vacuum chamber 95; and the vacuum chamber 95 is evacuated.

When the d.c. voltage generating circuit 22 is turned on under these conditions and a high voltage d.c. voltage is applied across the positive output terminal 32 and the negative output terminal 33, a glow discharge is generated across the positive output terminal 32 and the negative output terminal 33. Numeral 34 of FIG. 8 represents a virtual load showing the impedance across the positive output terminal 32 and the negative output terminal 33 occurring during discharging. At the time of a glow discharge, current is supplied from the d.c. voltage generating circuit 22 to the load 34 via the current limiting coil 24 and the resonant coil 39. The load 34 is therefore of a high impedance while the glow discharge is maintained.

When a glow discharge is generated, the target material is sputtered and a thin film comprised of the target material is formed on the substrate surface.

When an arc discharge is generated for whatever reason while a glow discharge is being generated, a large current is expected to flow from the positive output terminal 32 to the negative output terminal 33, but the flow of current from the positive output terminal 32 to the negative output terminal 33 cannot increase rapidly because of the current limiting coil 24, and the potential difference across the positive output terminal 32 and the negative output terminal 33 is small.

As the positive output terminal 32 is connected to earth, when the potential difference across the positive output terminal 32 and the negative output terminal 33 becomes small the potential of the terminal on the side of the negative electrode of a voltage sense capacitor 26 rapidly rises. The potential of the terminal on the positive electrode side of the voltage sense capacitor 6 also rises in accompaniment with the rise in the potential of the terminal on the negative electrode side. The potential of the terminal on the positive electrode side is higher than the earth potential because a primary winding 27 is connected to the terminal on the positive electrode side.

Figure 9:
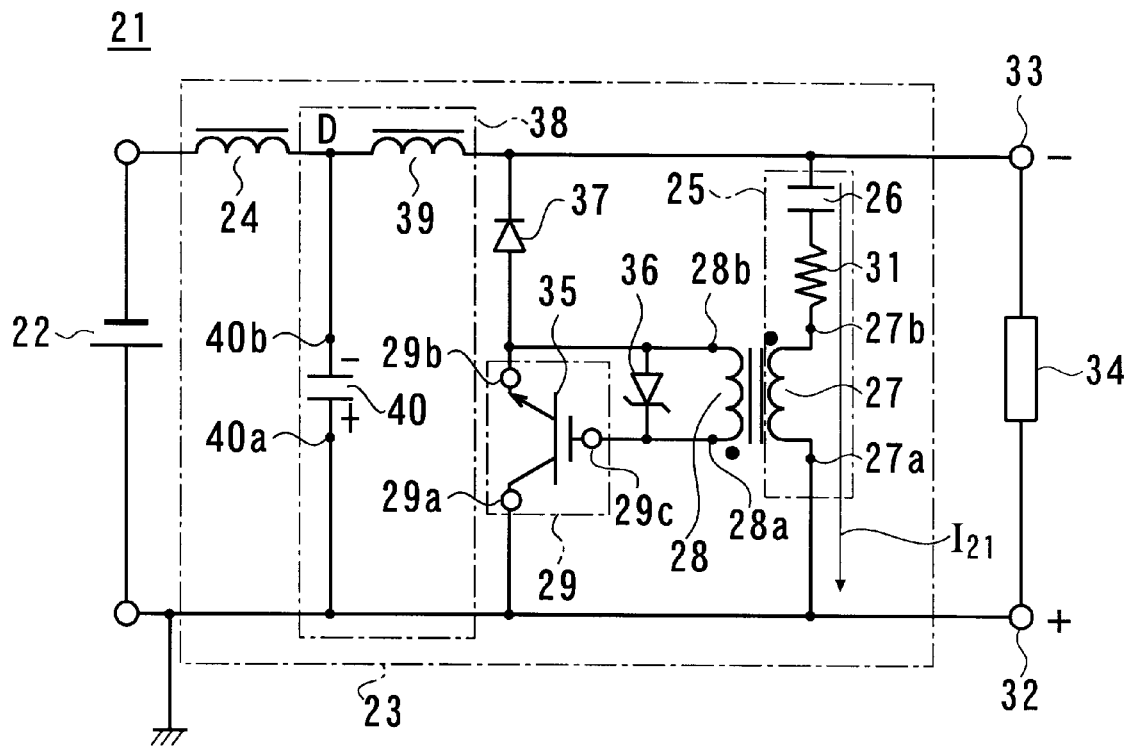
FIG. 9 is a first view showing current flowing in the power supply circuit of the further embodiment of the present invention.
Figure 10:
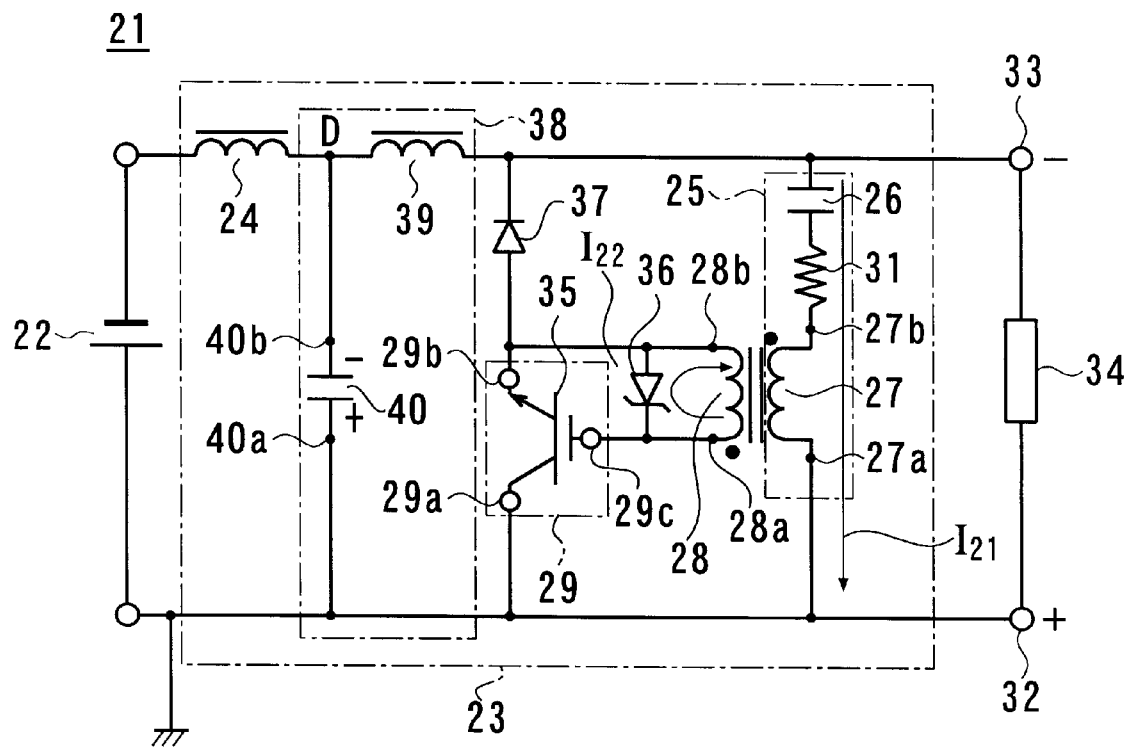
FIG. 10 is a second view showing current flowing at the power supply of the further embodiment of the present invention.

The voltage sense capacitor 26 is charged beforehand by a voltage generated by the d.c. voltage generating circuit 22 in a steady state with a glow discharge being generated, the voltage sense capacitor 26 is discharged, and a discharge current $I_{21}$ flows from the voltage sense capacitor 26 to the primary winding 27, as shown in FIG. 9.

When the discharge current $I_{21}$ flows, a voltage is induced at the secondary winding 28.

A first input/output terminal 29a of the switch element 29 is connected to the positive output terminal 32 and a second input/output terminal 29b is connected to the negative output terminal 33 via the reverse-flow prevention diode 37. A voltage that is positive with respect to the second input/output terminal 29b is applied to the first input/output terminal 29a. At this time, the cathode of the reverse-flow prevention diode 37 is connected to the second input/output terminal 29b and the anode is connected to the negative output terminal 33.

The secondary winding 28 is constructed in such a manner that a voltage of a positive polarity is induced at a terminal 28a on the side of a control terminal 29c and a voltage of a negative polarity is induced at the terminal 28b on the side of the second input/output terminal. When a voltage is induced at the secondary winding 28, a voltage higher than the voltage of the second input/output terminal 29b of the switch element 29 is applied to the control terminal 29c of the switch element 29. The emitter gate junction of the IGBT 35 is then biased and the switch element 29 conducts.

Figure 13:
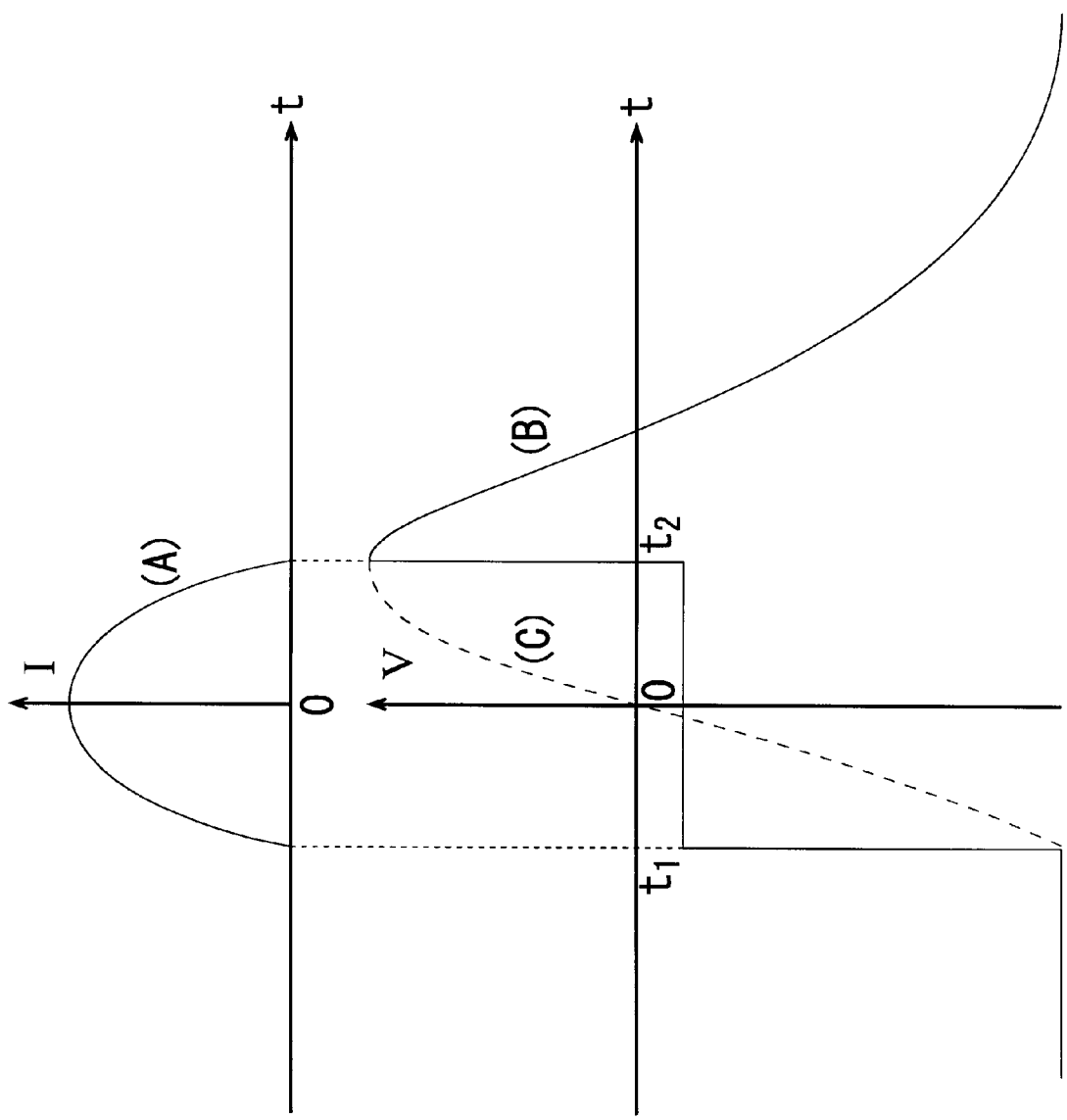
FIG. 13 is a view showing the operation of the power supply circuit of the further embodiment of the present invention.

When the switch element 29 conducts, the potential of the negative output terminal 33 rapidly rises so as to become substantially equal to the earth potential and the positive output terminal 32 and the negative output terminal 33 are short-circuited. An example of the potential of the negative output terminal 33 is shown by a curve (B) of FIG. 13. In FIG. 13, the potential of the negative output terminal 33 rapidly rises at time $t_1$ so as to become substantially the same potential as the earth potential.

When an arc discharge is generated, only an extremely short period of time (a few microseconds) elapses until the switch element 29 conducts and the positive output terminal 32 and the negative output terminal 33 are short-circuited so that an arc discharge that occurs once is almost instantaneously extinguished.

When the switch element 29 conducts, the arc discharge is extinguished and the discharge current $I_{21}$ flows from one terminal of the voltage sense capacitor 26 to the other terminal of the voltage sense capacitor 26 via a current limiting resistor 31, the primary winding 27, the switch element 29 and the reverse-flow prevention diode 37.

The resonant capacitor 40 within the resonance circuit 38 described above is pre-charged in a steady state by a voltage across the both terminals of the d.c. voltage generating circuit 22, a positive polarity voltage is generated at a terminal 40a on the positive electrode output terminal side and a voltage of a negative polarity is generated at a terminal 40b on the side of the resonant coil 39. When the switch element 29 conducts, a connection is made from the terminal 40a on the side of the positive electrode output terminal 32 of the resonant capacitor 40 to the terminal 40b on the side of the resonant coil 39 of the resonant capacitor 40 via the switch element 29, the reverse-flow prevention diode 37 and the resonant coil 39 so that a closed loop (hereinafter referred to as a "resonance closed loop") is formed.

Figure 11:
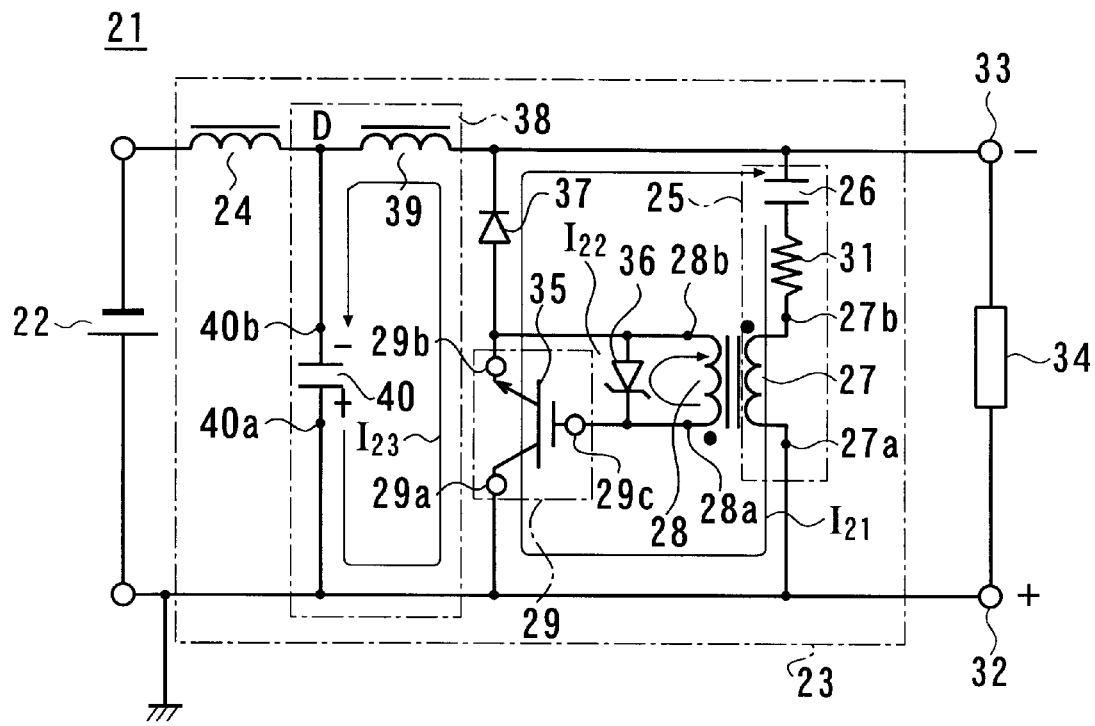
FIG. 11 is a third view showing current flowing at the power supply circuit of the further embodiment of the present invention.

When a resonance closed loop is formed, discharge of the resonant capacitor 40 commences and a current $I_{23}$ flows from the terminal 40a of the positive electrode side of the resonant capacitor 40 to the terminal 40b of the negative electrode side of the resonant capacitor 40 via the switch element 29, the reverse-flow prevention diode 37, and the resonant coil 39, as shown in FIG. 11. An example of a waveform for the current $I_{23}$ flowing at the resonant coil 39 is shown by a curve (A) in FIG. 13.

When the resonant capacitor 40 discharges and the current $I_{23}$ flows, the energy accumulated in the resonant capacitor 40 at the time of charging is transferred to the resonant coil 39 rand accumulated in the resonant coil 39. As the result, when the energy accumulated in the resonant capacitor 40 becomes 0 the discharge of the resonant capacitor 40 is complete.

After discharge is complete, energy shifted to the resonant coil 39 is shifted to the resonant capacitor 40, current continues to flow in the same direction as the current $I_{23}$, and the resonant capacitor 40 is charged to an opposite polarity in a steady state.

When the energy accumulated at the resonant coil 39 becomes 0, charging of the resonant capacitor 40 is complete. When charging is complete, a reverse polarity voltage of substantially the same magnitude as for a steady state occurs across the terminals of the resonant capacitor 40, the resonant capacitor 40 is discharged and a flow of current in the opposite direction to the current $I_{23}$ is expected in the resonance closed loop. However, the direction of flow of the current flowing in the opposite direction to the current $I_{23}$ is in the opposite direction to the forward direction of the reverse-flow prevention diode 37. The reverse-flow prevention diode 37 is therefore reverse biased and a current opposite in direction to the current $I_{23}$ does not flow at the resonance closed loop.

As a current opposite in direction to the current $I_{23}$ does not flow in the resonance closed loop, the potential of the terminals of the resonant coil 39 becomes substantially the same and the potential of a terminal D on the side of the current limiting coil 24 of the resonant coil 39 and the potential of the negative output terminal 33 are substantially the same.

An example of the potential of the terminal D on the side of the current limiting coil 24 of the resonant coil 39 is shown in a curve (C) of FIG. 13. In FIG. 13, at a time $t_2$ the potential of the negative output terminal 33 is substantially the same potential as the potential of the terminal D.

When the potential of the negative output terminal 33 becomes substantially the same potential as the terminal D, a voltage of a positive polarity occurring at the terminal on the negative electrode side of the resonant capacitor 40 is applied to the negative output terminal 33. The negative output terminal 33 therefore becomes of a higher potential than the ground potential of the positive output terminal 32 and the switch element 29 is forced into a non-conducting state.

Figure 12:
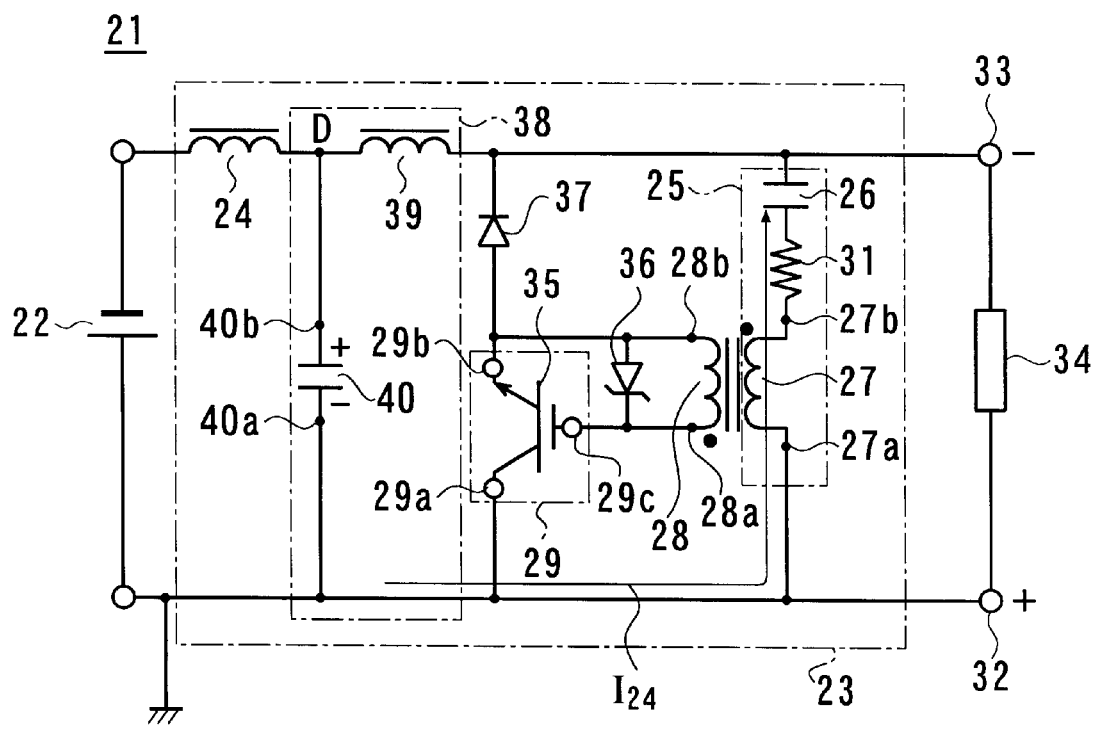
FIG. 12 is a fourth view showing current flowing at the power supply circuit of the further embodiment of the present invention.

When the switch element 29 is forced into a non-conducting state, as shown in FIG. 12, a current flows to the voltage sense capacitor 26 via the primary winding 27 and the current limiting resistor 31 and charging of the voltage sense capacitor 26 from the d.c. voltage generating circuit 22 commences. The potential of the negative output terminal 33 therefore falls from time $t_2$ of FIG. 13 onwards. A glow discharge is then possible when the potential of the negative output terminal 33 falls to the same potential as for the steady state.

As described above, the resonance circuit 38 is provided at the power supply 21 of FIG. 8. The switch element 29 can therefore be forced into a non-conducting state by the resonant circuit 39 even if the discharge current $I_{21}$ flows from the voltage sense capacitor 26 through the primary winding 27 after the switch element 29 is made to conduct and the arc discharge is extinguished.

The time until the switch element 29 is put into a non-conducting state can therefore be made shorter compared to the power supply 1 of FIG. 1 where the switch element 29 could not be put into a non-conducting state until the voltage sense capacitor 6 stopped supplying the discharge current $I_1$, and the time from extinguishing the arc discharge for returning to a steady state can be made shorter.

Figure 14:
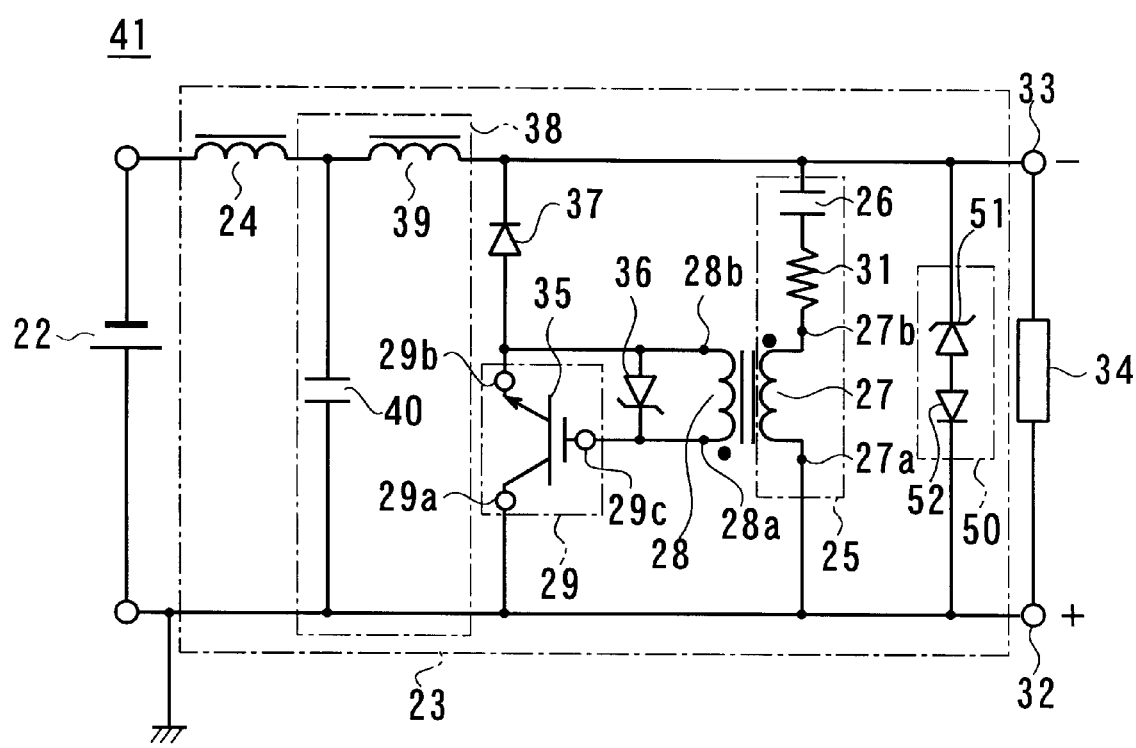
FIG. 14 is a circuit diagram showing a first modified example of the power supply circuit of the further embodiment of the present invention.

A voltage limiting circuit 50 can be provided to the power supply 21 shown in FIG. 8 as the power supply shown by numeral 41 of FIG. 14. This voltage limiting circuit 50 is a circuit where a constant voltage circuit 51 and a diode 52 are connected facing in opposite directions in series across the positive output terminal 32 and the negative output terminal 33, in parallel with the voltage sense circuit 25.

The diode 52 is configured with its anode connected to the positive output terminal 32 so as to be reverse-biased in a steady state. The constant voltage circuit 51 is configured in such a manner as to conduct when a voltage of a polarity such that the diode 52 is forward-biased is applied across the ends of the diode 52, with a current flowing in the constant voltage circuit 51 and the diode 52 when the constant voltage circuit 51 is conducting, and with the voltage of both ends thereof being maintained at a conduction voltage of a prescribed voltage when a current flows therein.

In a steady state, since the diode 52 is reverse-biased, a current does not flow into the voltage limiting circuit 50.

On the other hand, after the arc is extinguished, when the resonant capacitor 40 is charged by a voltage of a reverse polarity of substantially the same magnitude as that in the steady state, the potential of the negative output terminal 33 rises but does not rise to a potential greater than the conducting voltage because the voltage across the terminals of the constant voltage circuit 51 is maintained at the conducting voltage. The voltage across the positive output terminal 32 and the negative output terminal 33 therefore also does not rise to a voltage greater than the conducting voltage.

When the voltage limiting circuit 50 is not provided, as the arc discharge is extinguished and the potential of the negative output terminal 33 rises excessively, the voltage across the positive output terminal 32 that is at ground potential and the negative output terminal 33 that is at a positive voltage becomes a voltage at which arc discharges are possible and arc discharges may therefore occur again.

However, when the voltage limiting circuit 50 is provided at the power supply circuit 41 of FIG. 14, the voltage across the positive output terminal 32 and the negative output terminal 33 does not rise to greater than the conducting voltage for the constant voltage circuit 51 even when the reverse-flow prevention diode 37 is reverse biased.

In order to achieve this, the voltage across the positive output terminal 32 and the negative output terminal 33 that is at a positive voltage can be set so as to prevent a voltage at which arc discharges are possible from being reached by appropriately setting the conduction voltage.

It can therefore be ensured that the extinguished arc discharge does not re-occur after the reverse-flow prevention diode 37 is reverse biased.

At the power supply 21 in FIG. 8, during the time from activating the d.c. voltage generating circuit 22 to reaching a steady state where there is a glow discharge, the voltage sense capacitor 26 is charged, and when the potential of the negative output terminal 33 changes so that the switch element 29 conducts in such a manner that a state where an arc discharge is possible is entered directly before a glow discharge is generated, the arc extinguishing circuit 23 operates and the positive output terminal 32 and the negative output terminal 33 are short-circuited so that a glow discharge can no longer be generated.

Figure 15:
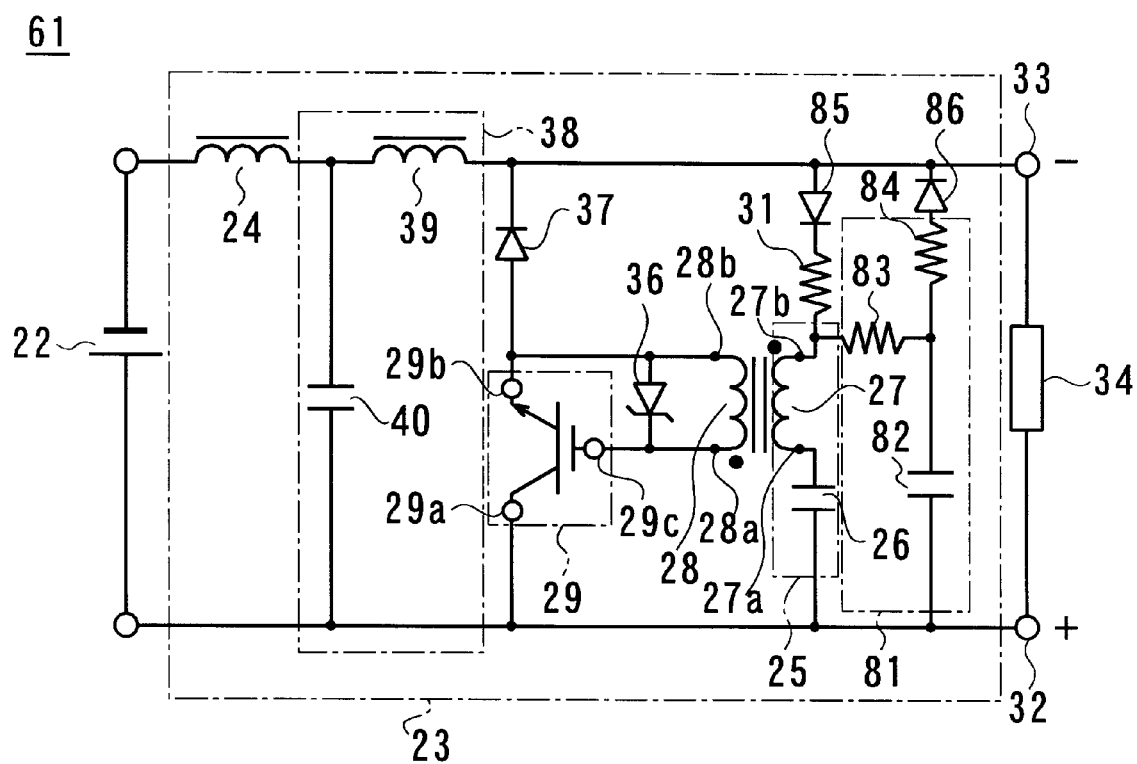
FIG. 15 is a circuit diagram showing a second modified example of the power supply circuit of the further embodiment of the present invention.

A power supply circuit 61 shown in FIG. 15 is therefore proposed. The power supply circuit 61 is further provided with a delay circuit 81 at the power supply 21 of FIG. 8. This delay circuit 81 comprises two delay resistors 83 and 84, and a delay capacitor 82, with one delay resistor 84 and the delay capacitor 82 being connected in series, one end of the delay capacitor 82 being connected to the positive output terminal 32 and one end of the other delay resistor 84 being connected to the negative output terminal 33 via a diode 86. One end of the other delay resistor 83 is connected to a terminal 27b on the negative electrode side of the primary winding 27 and the other end is connected to a connection part for the delay resistor 84 and the delay capacitor 82.

Figure 16:
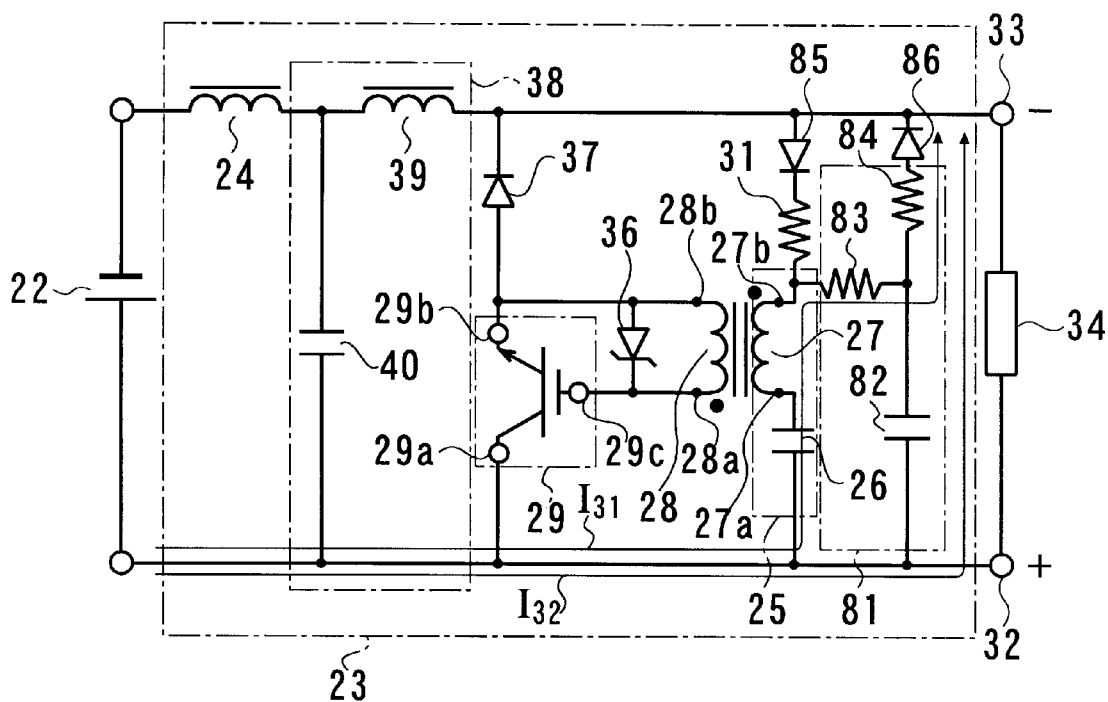
FIG. 16 is a view showing the operation of the second modified example of the power supply circuit of the further embodiment of the present invention.

As shown in FIG. 16, when the d.c. voltage generating circuit 22 is activated at the power supply circuit 61, a current $I31$ flows from the positive terminal of the d.c. voltage generating circuit 22 to the negative output terminal 33 via the voltage sense capacitor 26, primary winding 27, one delay resistor 83, the other delay resistor 84, and the diode 86, and the voltage sense capacitor 26 is charged. Moreover, a current $I_{32}$ flows from the positive electrode of the d.c. voltage generating circuit 22 to the negative output terminal 33 via the delay capacitor 82, the other delay resistor 84 and the diode 86 and the delay capacitor 82 is charged, so that the voltage sense capacitor 26 is charged and the time until the voltage across the both terminals of the voltage sense capacitor 26 becomes a fixed voltage is lengthened.

Therefore, before the potential difference across the positive output terminal 32 and the negative output terminal 33 reaches a potential difference at which a glow discharge is possible, the voltage across the terminals of the voltage sense capacitor 26 is prevented from reaching a voltage where current flows in the primary winding 27 and the switch element 29 conducts.

In this way, it can be ensured that the arc extinguishing circuit 23 does not operate in an erroneous manner and that the positive output terminal 32 and negative output terminal 33 are not short-circuited when a state, in which arc discharges are possible, is reached directly before a glow discharge is generated; and a glow discharge can therefore be generated in a reliable manner.

In FIG. 8 to FIG. 16 the switch element 29 comprises an n-channel-type IGBT but the switch element 29 of the present invention is by no means limited in this respect and may also comprise, for example, a p-channel-type IGBT, an NPN-type transistor, a PNP-type transistor or a MOSFET, etc.

As described above, the power supply circuit of the present invention can be used as a power supply for generating a glow discharge in a stable manner and can particularly be applied in manufacturing thin-film apparatus such as sputtering apparatus, etc.

What is claimed is:
1. An arc extinguishing circuit comprising:
   a switch element equipped with a control terminal and two input/output terminals, with conduction across said two input/output terminals being based on a voltage inputted to said control terminal;

a sense circuit, being a circuit having a primary winding and a voltage sense capacitor connected in series, with one end thereof connected to one input/output terminal and a remaining end thereof connected to said remaining input/output terminal;

a secondary winding being magnetically coupled with said primary winding and having one end connected to said control terminal and a remaining end connected to one of said input/output terminals, wherein a voltage at said secondary winding is capable of being induced to have said switch element short circuit said input/output terminals so as to extinguish arc discharge when said arc discharge occurs between said input/output terminals; and a d.c. voltage generating circuit and a voltage limiting circuit, said d.c. voltage generating circuit being connected to said one end of said sense circuit, and said voltage limiting circuit being connected to said remaining end of said sense circuit.

2. The arc extinguishing circuit according to claim 1, wherein when a trigger current flows in said primary winding, said voltage sense capacitor discharges due to said switch element conducting due to a voltage induced in said secondary winding, and a discharge current flows in said primary winding, said discharge current flowing in said primary winding in said same direction as said trigger current.

3. The arc extinguishing circuit according to claim 1, further comprising at least one inductance element, with one end of said inductance element being connected to at least one of said input/output terminals.

4. An arc extinguishing circuit comprising:

a switch element equipped with a control terminal and two input/output terminals, with conduction across said two input/output terminals being based on a voltage inputted to said control terminal;

a sense circuit, being a circuit having a primary winding and a voltage sense capacitor connected in series, with one end thereof connected to one input/output terminal and a remaining end thereof connected to said remaining input/output terminal;

a secondary winding being magnetically coupled with said primary winding and having one end connected to said control terminal and a remaining end connected to one of said input/output terminals;

a resonant circuit, constituted by a resonant inductance element and a resonant capacitor connected in series, with one end thereof connected to one input/output terminal and a remaining end thereof connected to said remaining input/output terminal; and a diode inserted across at least one of said one end of said resonance circuit and said one input/output terminal or a remaining terminal of said resonance circuit and said remaining input/output terminal.

5. The arc extinguishing circuit according to claim 4, further comprising at least one inductance element, with one end of said inductance element being connected to a terminal of said resonant capacitor.

6. The arc extinguishing circuit according to claim 5, further comprising a voltage limiting circuit connected in parallel with a voltage sense circuit and constructed in such a manner as to prevent a voltage across the terminals of said voltage sense circuit from rising above a fixed voltage when a voltage of a polarity which is opposite to a polarity in a steady state occurs across the terminal of said resonant capacitor.

7. An arc extinguishing method comprising the steps of:

pre-charging a resonant capacitor while supplying a fixed voltage to a load from first and second output terminals in a steady state;

when load impedance rapidly drops, sensing the rapid drop in impedance, causing a switch element connected across said first and second output terminals to conduct, short-circuiting said first and second output terminals, and discharging said resonant capacitor;

causing the discharged current to flow through a resonant inductance, and causing said resonant capacitor and said resonant inductance element to resonate;

generating a voltage, of a polarity which is opposite to the polarity generated in the steady state, at said resonant capacitor due to said resonance; and putting said switch element into a non-conducting state using the reverse voltage and having the voltage across said first and second output elements revert to the steady state voltage.

8. The arc extinguishing method according to claim 7, further comprising the steps of:

pre-inserting a diode element in the path of current flowing between said first and second output terminals via said switch element when said switch element is in a conducting state and said first and second output terminals are short-circuited; and reverse biasing said diode element by using a voltage generated at said resonant capacitor of an opposite polarity to the voltage generated in a steady state so as to halt resonance when a current flows between said first and second output terminals via said switch element.

9. The arc extinguishing method according to claim 8, further comprising the steps of:

connecting a circuit constituted by a voltage sense capacitor and said primary winding connected in series across said first and second output terminals and pre-charging said voltage sense capacitor in the steady state; and when the load impedance falls rapidly, causing a current to flow in said primary winding due to discharging of said voltage sense capacitor, inducing a voltage in a secondary winding magnetically coupled with said primary winding, and putting said switch element into a conducting stage using the voltage induced at said secondary winding.

10. The arc extinguishing method according to claim 9, further comprising the steps of:

connecting a delay circuit to a voltage sense capacitor; and increasing the time taken from commencing charging of said voltage sense capacitor until the voltage across both terminals of said voltage sense capacitor becomes the voltage across both terminals occurring in the steady state by using said delay circuit.

* * * * *